United States Patent [19]

Drebinger et al.

[11] 4,369,427

[45] Jan. 18, 1983

[54] METHOD AND CIRCUIT ARRANGEMENT FOR DETERMINING THE ENTRY AND/OR EXIT OF A VEHICLE, IN PARTICULAR A TRAFFIC VEHICLE, INTO AND OUT OF A PREDETERMINED MONITORING ZONE

[75] Inventors: Peter Drebinger, Munich; Heinz Merkle, Graefelfing, both of Fed. Rep. of Germany

[73] Assignee: Siemens Aktiengesellschaft, Berlin & Munich, Fed. Rep. of Germany

[21] Appl. No.: 156,408

[22] Filed: Jun. 4, 1980

[30] Foreign Application Priority Data

Jul. 20, 1979 [DE] Fed. Rep. of Germany ....... 2929494

[51] Int. Cl.[3] ........................ G08G 1/01; G01R 33/12

[52] U.S. Cl. ............................. 340/38 L; 235/92 TC; 324/236; 340/551

[58] Field of Search .................. 340/38 R, 38 L, 551, 340/552, 567; 235/92 TC; 324/236, 239, 260; 364/436, 437

[56] References Cited

U.S. PATENT DOCUMENTS

| | | | |
|---|---|---|---|
| 3,205,352 | 9/1965 | Prucha | 340/38 L |
| 3,868,626 | 2/1975 | Masher | 340/38 L |
| 3,873,964 | 3/1975 | Potter | 340/38 L |
| 3,875,555 | 4/1975 | Potter | 340/38 L |
| 3,980,867 | 9/1976 | Potter | 340/38 L |
| 3,989,932 | 11/1976 | Koerner | 340/38 L |
| 4,131,848 | 12/1978 | Battle | 324/236 |

*Primary Examiner*—James J. Groody

*Attorney, Agent, or Firm*—Hill, Van Santen, Steadman, Chiara & Simpson

[57] ABSTRACT

A method and a circuit arrangement for determining the entry and/or exit of a vehicle into or out of a predetermined monitoring zone, which is defined by at least one inductive measuring loop whose change in inductance, which occurs as a result of the entry of a vehicle into the monitoring zone or the exit of a vehicle out of the monitoring zone, is used to control the oscillation frequency of an oscillator circuit is disclosed. In this method a measuring signal which corresponds to the oscillation frequency of the oscillator circuit and a reference signal which corresponds to a reference oscillation frequency are subtracted from one another. The difference signal thus formed is processed in an analysis device for display purposes. In order to achieve a relatively high degree of measuring accuracy, while employing circuit components which possess a relatively low operating frequency, it is provided that the measuring signal which corresponds to the oscillation frequency of the oscillator circuit is obtained and that on the occurrence of a first measuring pulse in a measuring pulse sequence derived from the oscillation signal of the oscillator circuit and with a reduced pulse rate, at the beginning of a measuring interval determined by a preselectable number of measuring pulses, a bistable trigger element is set to emit a specific output signal. On the occurrence of the output signal, which, for the duration of the selected measuring interval, counting pulses are counted with a pulse rate which is high in comparison to the pulse rate of the measuring pulses in a counting pulse counter whose counter signal, which is emitted at the end of the selected measuring interval, is made available as the measuring signal which corresponds to the oscillation frequency of the oscillator circuit.

9 Claims, 3 Drawing Figures

METHOD AND CIRCUIT ARRANGEMENT FOR DETERMINING THE ENTRY AND/OR EXIT OF A VEHICLE, IN PARTICULAR A TRAFFIC VEHICLE, INTO AND OUT OF A PREDETERMINED MONITORING ZONE

BACKGROUND OF THE INVENTION

1. Field of the Invention

The invention relates to a method and a circuit arrangement for determining the entry and/or exit of a vehicle, in particular a traffic vehicle, into and out of a predetermined monitoring zone, comprising at least one inductive measuring loop which determines the monitoring zone and whose change in inductance, which results from the entry of a vehicle into the monitoring zone or the exit of a vehicle out of the monitoring zone, is used to control the oscillation frequency of an oscillator circuit, and more particularly wherein a measuring signal which corresponds to the relevant oscillation frequency of the oscillation circuit and a reference signal which corresponds to a reference oscillation frequency are subtracted from one another, and the established difference signal is processed in an analysis device for display purposes.

2. Description of the Prior Art

A method and a circuit arrangement of the above described type are already known in the art from U.S. Pat. No. 3,205,352. In this known method and in the known circuit arrangement which operates in accordance with this method, the oscillation signals emitted from a reference oscillator and from a loop oscillator which is connected to the inductive measuring loop are fed to a difference frequency detector whose output is connected to an analysis device whose components include a frequency selective amplifier and a detector. A disadvantage of this known method and of the corresponding known circuit arrangement is that, overall, only a relatively poor measuring accuracy is achieved at a viable expense. Moreover, it is occasionally considered disadvantageous that, in practice, in the known circuit arrangement only analog circuit elements can be used.

However, circuit arrangements constructed with digital-operating circuit elements are also known for determining the entry and/or exit of vehicles into and out of a predetermined monitoring zone for example U.S. Pat. No. 3,875,555. In this process, the loop oscillator which is connected to an inductive measuring loop is followed by a digital counter, and the reference oscillator is likewise followed by a digital counter. The counts reached by these counters are subjected to difference formation, and the difference signal thus formed is checked in an analysis device which contains a threshold value. In order to establish determinate measuring times, the two digital counters are supplied at special resetting inputs with control pulses which determine the times at which counting processes are initiated.

In order to achieve a higher measuring accuracy in this respect than the known circuit arrangement considered in the introduction, it is necessary to use digital-operating circuit elements with a high operating frequency at least in the control circuit zone which controls the operating sequence of the counters and of the analysis device. However, this involves the disadvantage of a relatively high circuitry expense. In other words, this means that the known circuit arrangements referred to above are not readily suitable to be constructed from electronic components which possess a relatively low operating frequency.

A digital loop detector system is also known from U.S. Pat. No. 3,868,626 in which the oscillation signals emitted from a loop oscillator which is connected to an inductive measuring loop are used to control a gate circuit which at its input is supplied with pulses emitted from a quartz-stabilised pulse generator and which at its output end is connected to an accumulator counter and also to a reference counter. The reference counter and the accumulator counter are connected by their outputs to a comparator which compares the count of the reference counter with that of the accumulator counter. The accumulator counter always contains the reference count determined by the preceding comparison. Therefore, in practice, the comparator compares a "current" count of the accumulator counter with an "old" count of the reference counter. When a stipulated threshold value is exceeded by the count difference thus established, a corresponding output signal is emitted. This known system also involves the disadvantage that, in order to achieve as high as possible a measuring accuracy, it is necessary to use circuit elements with a high operating frequency at least in the control circuit section. Furthermore, another disadvantage of the known system is that the slow changing frequency of the loop oscillator results in relatively small differences in the counts of the accumulator counter and the reference counter.

Finally, an arrangement is also known from U.S. Pat. No. 3,989,932 for establishing the presence of a vehicle in a zone of a line loop in which the line loop is connected to an oscillator which oscillates at a frequency which is dependent upon the inductance of the line loop. In this known arrangement a time clock circuit is provided which counts the duration of a predetermined number of periods of the oscillator signal. A reference signal stage is also provided which supplies a signal corresponding to a reference duration. A comparator stage determines the difference between the measured duration and the reference duration. Furthermore, the known arrangement comprises an analysis device having a threshold value stage which responds to a difference signal which exceeds a threshold value, and which produces a signal which indicates the presence of a vehicle in the predetermined zone of the line loop. Fundamentally, the construction of this known arrangement is identical to that of the known circuit arrangement considered in the introduction, although in contrast to the that circuit arrangement, in which frequency values are produced and related to one another, in the last-considered known arrangement time values are produced and related to one another. Although the last considered known arrangement operates on a digital basis, it also involves the disadvantage that, in order to achieve an adequate measuring accuracy, it is necessary to use circuit elements which have a relatively high operating frequency. This applies in particular to the control circuit which controls the time clock circuit and the reference signal stage.

SUMMARY OF THE INVENTION

Accordingly, the object of the invention is to provide a measuring principle which is suitable for determining the entry and/or exit of a vehicle, in particular a road traffic vehicle, into and out of a predetermined monitoring zone and which, in comparison to the measuring principles used in the previously known corresponding circuit arrangements, allows the use of a control and analysis device which can operate at a relatively low operating frequency, but nevertheless permits a high measuring accuracy.

This object is realised in a method of the type generally described above and, in accordance with the invention, wherein the measuring signal, which corresponds to the relevant oscillation frequency of the oscillator circuit, is obtained, and, on the occurrence of the first measuring pulse of a measuring pulse sequence derived from the oscillation signal of the oscillator circuit, and at a stepped-down pulse rate, at the beginning of a measuring interval determined by a preselectable number of measuring pulses, a bistable trigger element is set and emits a specific output signal. On the occurrence of this output signal, and for the duration of the selected measuring interval, counting pulses are counted at a pulse rate which is high relative to the pulse rate of the measuring pulses in a counting pulse counter whose counter signal, which is emitted at the end of the selected measuring interval, is made available as the measuring signal which corresponds to the oscillation frequency of the oscillator circuit.

The invention involves the advantage of a relatively simple measuring principle. The use of the bistable trigger element facilitates, in a relatively simple fashion, the establishment of the measuring interval which governs the counting pulse counter without the need for a control circuit operating at a high speed. In fact, the bistable trigger element is set only by the first measuring pulse of the measuring pulse sequence derived from the oscillation signal of the oscillator circuit at a reduced pulse rate, in order to establish the beginning of the measuring interval for the counting pulse counter. As a result, however, the bistable trigger element must have a high operating frequency in order that the beginning of the aforementioned measuring interval may be accurately determined.

Preferably, in a method corresponding to the invention, the difference signal obtained by forming the difference between the measuring signal and the reference signal is firstly compared with a first threshold value and in the event that it exceeds this threshold value is compared with a comparitively lower second threshold value. This results in the advantage of particularly high operating reliability. In addition this measure advantageously helps in the reliable determination in the monitoring zone of lorries and other vehicles whose entry into the monitoring zone initially results in a relatively strong frequency detuning of the oscillator circuit which is connected to the inductive measuring loop and thereafter results in a comparitively smaller frequency detuning. Furthermore, the hysteresis provided by the comparison of the difference signal with various threshold values results in the advantage that when a vehicle of the type in question enters the monitoring zone only one output signal is emitted.

It is expedient to carry out the method of the invention by means of a circuit arrangement comprising at least one inductive measuring loop which is connected to an oscillator circuit whose oscillation signals serve to determine the entry and/or exit of a vehicle into and out of the monitoring zone determined by the measuring loop. The difference is formed between a measuring signal corresponding to these oscillation signals and a reference frequency signal, and the difference signal formed by this difference formation is processed in an analysis device which contains a threshold value. In accordance with the invention, this circuit arrangement is characterized in that the output of the oscillator circuit is connected to the input of a pulse shaper step-down circuit which, in response to the oscillation signals emitted from the oscillator circuit, emits measuring pulses which correspond to these oscillation signals but are stepped down in frequency. This output of the pulse shaper step-down circuit, hereinafter simply referred to as a frequency divider, is connected to the input of a measuring interval counter having preset facilities and a bistable trigger element. The input of the bistable trigger element is also supplied with a signal which controls the enabling of the aforementioned measuring interval counter. The output of the bistable trigger element is connected to one input of a logic combining element. The logic combining element is connected by another input to a counting pulse generator which emits counting pulses at a pulse rate which is higher than that of the pulses emitted from the pulse shaper step-down circuit. The output of the logic combining element is connected to the input of a counting pulse counter. The output of the counting pulse counter is connected to a transfer register which is actuated in order to transfer the count of the counting pulse counter at the end of the measuring interval determined by the setting of the measuring interval counter. The output of the transfer register is connected to the input side of a subtractor device whose input is also supplied with a reference signal. The output side of the subtractor device is connected to a comparator which compares the difference signals with which it is supplied from the subtractor device with a threshold value signal and which emits an output signal corresponding to the result of the comparison. This results in the advantage of the relatively low circuitry expense for the construction of a circuit arrangement which serves to implement the method in accordance with the invention.

Preferably, the comparator is connected by its input to one of two threshold value generators, of which the threshold value generator which produces the higher threshold value is the first to be set in operation, whereas the threshold value generator which produces the lower threshold value is not operative until the comparator has established the fact that the threshold value produced by the first threshold value generator has been exceeded by the difference signal emitted from the subtractor device. This results in the advantage of a particularly low circuitry expense for the construction of a circuit arrangement with the aid of which it is possible to determine the presence in the monitoring zone of vehicles which firstly result in the emission of a relatively high difference signal and then of a comparitively lower difference signal, which applies in particular to trucks. As a result, advantageously only one output signal is emitted for vehicles of this kind.

Advantageously, the comparator which serves to carry out the comparison between the signals with which it is supplied at its inputs is not enabled until the expiration of the measuring interval determined by the setting of the measuring interval counter. This results in the advantage that, with a particularly low circuitry expense, it is ensured that the comparison is always based on definite circuit conditions or circuit states.

The reference signal which is fed to the subtractor device is advantageously produced by a reference signal register which, together with the transfer register, can be brought into a predetermined starting state in response to special operation. This involves the advantage that the circuit arrangement in question can be brought into a specific starting state in a relatively simple fashion, when necessary. It is also advantageous to proceed in such manner that the contents of the reference signal register is periodically modified in order to take into account environmental influences. This corrective measure can consist in that when any vehicles move out of the monitoring zone in question, the reference signal register is supplied, in stepped fashion, with a register content which corresponds to the current contents of the transfer register; and the contents of the transfer register characterizes the state in which no vehicle is present in the monitoring zone.

When a plurality of measuring loops each with an assigned oscillator circuit are to be used, preferably each oscillator circuit can be individually connected to the input side of the frequency divider, and at the same time the output of the comparator is connected to an output terminal assigned to the oscillator circuit in question. This results in the advantage of a particularly low circuitry expense for the detection of the states prevailing in a majority of measuring loops and for the emission of the special output signals assigned to these states.

During the course of the enabling of its counting operation, the measuring interval counter is advantageously supplied with a reset signal which is also supplied to the counting pulse counter in order that it may be reset. This involves the advantage that, in a relatively simple manner, it is possible to begin from determinate counts in the measuring interval counter and in the counting pulse counter.

Preferably, the control of the counting of the measuring pulses which determine the duration of the measuring intervals, the transfer of the counting pulses counted by the counting pulse counter in the transfer register, the formation of the difference between the counting pulses received by the transfer register and a reference signal, and the comparison of the difference signal thus formed with a threshold value signal is carried out in an analysis device which contains a microprocessor and assigned program memory or in an analysis device formed by a microprocessor and assigned program memory. This results in the advantage of a particularly low circuitry expense for the execution of the aforementioned control functions.

BRIEF DESCRIPTION OF THE DRAWINGS

Other objects, features and advantages of the invention will be best understood from the following detailed description, taken in conjunction with the accompanying drawings, on which.

DESCRIPTION OF THE PREFERRED EMBODIMENTS

Figure 1:
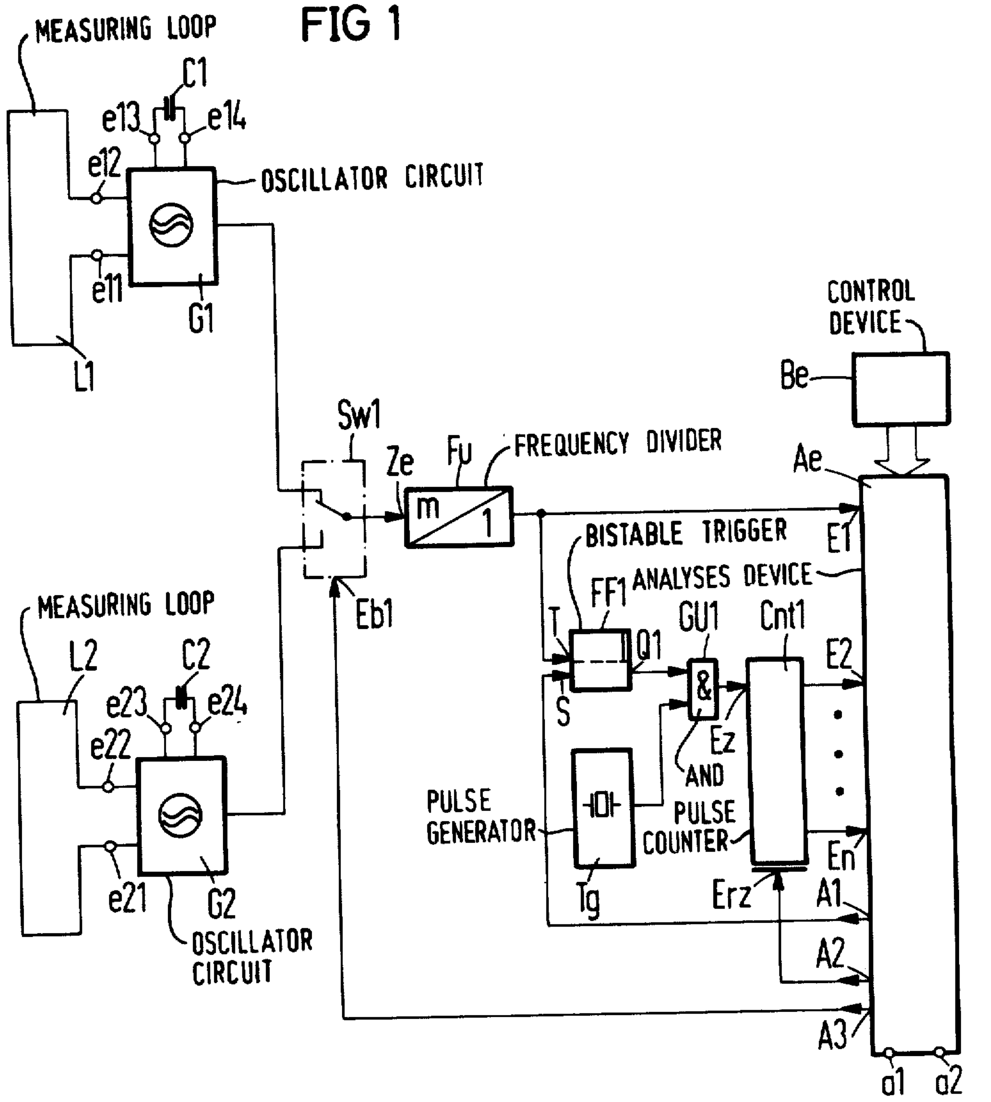
FIG. 1 is a block circuit diagram of a circuit arrangement in accordance with the invention.

The circuit arrangement illustrated in the block circuit diagram in FIG. 1 comprises two inductive measuring loops L1 and L2 which determine a monitoring zone within which the entry and/or exit of vehicles, and, in particular road vehicles, can be determined. That is to say that when a vehicle enters the zone determined by one of the inductive measuring loops L1, L2 a change occurs in the inductance of the relevant measuring loop. Generally speaking, the entry of a vehicle into the zone determined by an inductive measuring loop results in a reduction in inductance. This reduction in inductance is recognized and analysed.

In order to be able to carry out the aforementioned functions, the inductive measuring loop L1, L2, which for example can be installed in a roadway, is connected at input terminals e11, e12 and e21, e22 respectively to an oscillator circuit G1 and G2 respectively. For the reduction of interference radiation, these oscillator circuits will be assumed to produce sinusoidal oscillations having a frequency in the range from 40–110 kHz. In FIG. 1 the oscillator circuits G1, G2 are also accompanied by frequency determining capacitors C1, C2 which are connected to input terminals e13, e14 and e23, e24 of the relevant oscillator circuit G1 and G2, respectively. By changing the capacitance values of the capacitors C1, C2 it is possible to change the oscillating frequencies of the oscillator circuits in a known fashion.

The outputs of the oscillator circuits G1, G2 are connected via a transfer switch Sw1 to an input Ze of a frequency divider circuit Fu which, in response to the oscillation signals with which it is supplied at its input, emits from its output pulses which serve as measuring pulses and form part of a measuring pulse train which, relative to the oscillation periods of the oscillation signals emitted from the oscillator circuit G1, G2 has a pulse rate which is stepped down in frequency by the factor m. The step-down ratio of the pulse shaper step-down circuit Fu can amount to for example 1:16.

Figure 2:
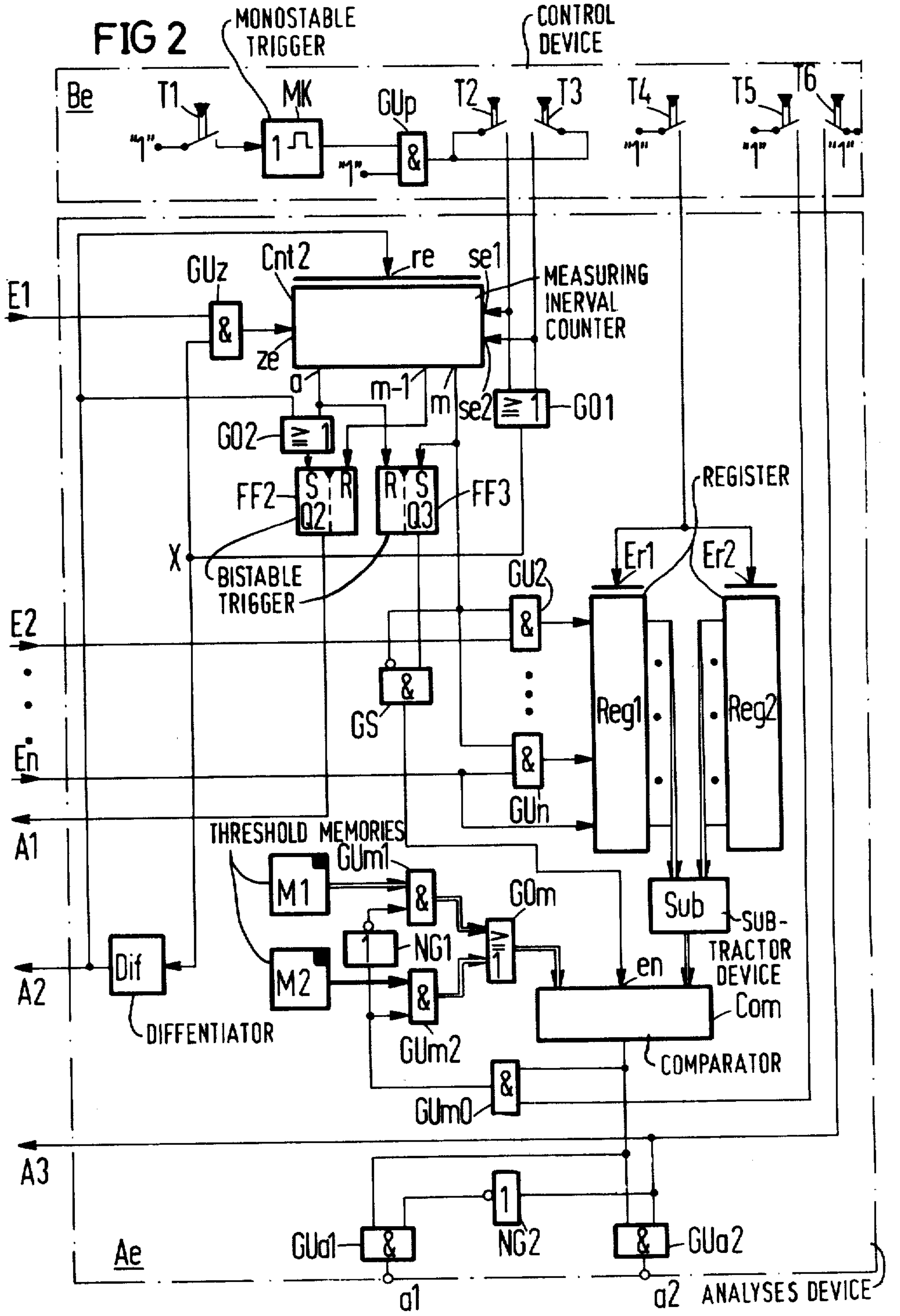
FIG. 2 illustrates the detailed construction of an analysis device with assigned control device as provided in the circuit arrangement shown in FIG. 1.

The output of the frequency divider circuit Fu is connected to an input E1 of an analysis device Ae in which, as will become more apparent from FIG. 2, the measuring pulse sequence emitted from the frequency divider Fu is fed to a measuring interval counter. The output of the frequency divider Fu is also connected to an input of a bistable trigger element FF1. In this example, this will be assumed to be the clock input T of the bistable trigger element FF1 which will be assumed to be an edge-controlled trigger element. The bistable trigger element FF1 is connected by a setting input S to an output A1 of the analysis device Ae.

The bistable trigger element FF1 is connected by its output Q1, which in the set state carries a binary "1", to an input of a logic combining element GU1 formed by an AND gate. This logic-combining element GUL is connected by a further input to the output of a counting pulse generator Tg which emits counting pulses with a pulse rate which is high relative to the pulse rate of the pulses emitted from the frequency divider Fu. The counting pulse generator Tg will be assumed to emit counting pulses with a pulse rate of frequency of 8 MHz.

The logic combining element GU1 is connected by its output to a counting input Ez of a counting pulse counter Cnt1. This counting pulse counter Cnt1 is connected by its output to inputs E2 to En of the analysis device Ae. Via these inputs the analysis device Ae is supplied by the counting pulse counter Cnt1 with the counter signals which correspond to its particular count.

The counting pulse counter Cnt1 is connected by a reset input Erz to a further output A2 of the analysis device Ae. This analysis device Ae includes a further output A3 which is connected to a transfer input Eb1 of the aforementioned transfer switch Sw1. When an appropriate output signal is emitted from this output A3 it is possible to set the transfer switch Sw1 either in the position illustrated in FIG. 1 or in the other switch position.

As regards the analysis device Ae, two further terminals a1 and a2 are also indicated in FIG. 1. These terminals a1, a2 represent output terminals at which the analysis device Ae will be assumed to emit signals which are characteristic of the presence of a vehicle in the zone corresponding to the relevant inductive measuring loop L1, L2. The output terminal a1 of the analysis device Ae can be assigned to the measuring loop L1 and the output a2 to the measuring loop L2.

The analysis device Ae indicated in FIG. 1 is also connected to a control device Be which, as will become more apparent when FIG. 2 is considered below contains control elements which serve to set and control the operation of the analysis device Ae.

The structure illustrated in FIG. 2 shall now be considered in detail, FIG. 2 illustrating a possible construction of the analysis device Ae indicated in FIG. 1 and the control device Be connected thereto. In accordance with FIG. 2 the analysis device Ae comprises the measuring interval counter Cnt2 which has already been referred to in association with FIG. 1 and which is connected by a counting input to the output of an AND gate GUz. The AND gate GUz is connected by one input to the input E1 of the analysis device Ae. The AND gate GUz is connected by a further input to the output of an OR-gate GO1, via a circuit point X, which is connected by its two inputs via the switches T2 and T3 contained in the control device Be to the output of an AND gate GUp which is likewise contained in the control device Be. The two switches T2 and T3 are also connected to setting inputs se1, se2 of the measuring interval counter Cnt2.

The aforementioned AND gate GUp is connected by one input to a circuit point which continuously carries a signal corresponding to a binary "1". At its other input the AND gate GUp is connected to the output of a monstable trigger element MK which is connected by its input via a switch T1 to a circuit point which likewise continuously carries a signal corresponding to the binary "1". In response to the actuation or closure of the switch T1, the AND gate GUp becomes ready to emit a binary "1" during the interval of time in which the monostable trigger element MK occupies its unstable trigger state. This binary "1" which is emitted from the output of the AND gate GUp is fed via one of the switches T2, T3 which are to be closed to one of the setting inputs se1, se2 of the measuring interval counter Cnt2, and via the OR gate GO1 to one input of the AND gate GUz. As a result of the aforementioned operation of the setting input se1, se2 of the measuring interval counter Cnt2, the latter is set to count in accordance with one of two different counting modes. This means that depending upon the setting of the measuring interval counter Cnt2, its counting capacity will differ. Thus, in its first position the measuring interval counter Cnt2 can start a new counting cycle after 10 measuring pulses have been received for example, and in the other setting can begin a new counting cycle after, for example, 200 measuring pulses have been received.

The measuring pulses which are to be supplied to the measuring interval counter Cnt2 are fed across the AND gate GUz which is enabled by the aforementioned binary "1" emitted from the output of the OR gate GO1. The binary "1" emitted from the output of the OR gate GO1 is also fed to the input of a differentiator Dif whose output is connected to the output A2 of the analysis device Ae. Furthermore, the differentiator Dif is connected at its output to a resetting input re of the measuring interval counter Cnt2 and to an input of a further OR gate GO2. In response to the occurrence of a binary "1" at the input of the differentiator Dif, the latter emits from its output an output pulse having a level which corresponds to a binary "1".

The OR gate GO2 is connected by a further input to an output a of the measuring interval counter Cnt2. The output a of the measuring interval counter Cnt2 will be assumed to represent the first output of this counter which, during each counting cycle of the counter, carries a binary "1" in the first counter position. The output a of the counter Cnt2 is also connected to the reset input R of a bistable trigger element FF3. The bistable trigger element FF3 is connected by its setting input S to an output m of the measuring interval counter Cnt2. The counter Cnt2 emits a binary "1" from this output m at the end of its counting cycle.

A further bistable trigger element FF2 is connected by its reset input R to an output m−1 of the measuring interval counter Cnt2. In its next to last counter position the measuring interval counter Cnt2 emits a binary "1" from the output m−1 within each counting cycle. The aforementioned bistable trigger element FF2 is connected by a setting input S to the output of the aforementioned OR gate GO2. The bistable trigger element FF2 is connected by its output Q2, which in the set state carries a binary "1", to the output A1 of the analysis device Ae.

The above-considered bistable trigger element FF3 is connected by its output Q3, which in the set state conducts a binary "1", to the signal input of a blocking element GS. The blocking element GS is connected by its blocking input to the last output m of the measuring interval counter Cnt2. The blocking element GS is connected by its output to an enabling input en of a comparator Com. A binary "1" which occurs at this enabling input en of the comparator Com enables the comparator Com to carry out a comparison between signals with which it is supplied at its inputs. This will be discussed in further detail below.

Logic combining elements GU2 - - - GUn are also each connected by one input to the output m of the measuring interval counter Cnt2. At their other inputs these elements, which can be AND gates GU2 - - - GUn are also each connected by one input to the output m of the measuring interval counter Cnt2. At their other inputs these AND gates GU2 - - - GUn are connected to the inputs E2 to En of the analysis device Ae. At their outputs the AND gates GU2 - - - Gun are connected to corresponding inputs of register stages of a transfer register Reg1. The input En of the analysis device Ae is also directly connected to at least one register stage of the transfer register Reg1. Via this combination, counter overflow signals of the counting pulse counter Cnt1 are introduced into the transfer register Reg1 in accordance with FIG. 1.

The transfer register Reg1 is connected by the output of its individual register stages to one input side of a subtractor device Sub. At a further input side this subtractor device Sub is connected to the output of register stages of a further register Reg2 which, by way of reference register, supplies the subtractor device Sub with a reference signal.

The two registers Reg1 and Reg2 are connected by control inputs Er1 and Er2 respectively to a switch T4 which is contained in the control device Be and which, when it is closed, emits a binary "1" to the relevant control inputs of the registers Reg1, Reg2. As a result of the occurrence of a binary "1" of this kind, the two registers Reg1, Reg2 are each brought into a definite starting state. At this point it should further be noted that, as a deviation from the conditions indicated in FIG. 2, it is also possible to proceed in such manner that the control input Er2 of the register Reg2 may be supplied with correcting signals. Consequently, during operation the contents of the register Reg2, which is employed as reference register, may be brought up to the contents of the transfer register Reg1, which is effected, in particular, when the inductances of the inductive measuring loops L1 and L2 provided in the circuit arrangement shown in FIG. 1 are not currently influenced by any vehicles. For this purpose, the outputs of the register Reg1 can be temporarily connected to corresponding inputs of the register Reg2.

The subtractor device Sub is connected by its output to one input of the aforementioned comparator Com. At its input this comparator Com is also connected to a threshold value signal generator comprising two registers or memories M1, M2 which contain threshold value signals corresponding to various threshold values. At its output the memory M1 is connected via AND gates, of which only one AND gate GUm1 is illustrated in FIG. 2, and via OR gates, of which only one OR gate GOm is illustrated in FIG. 2, to the input side of the comparator Com. At its output the memory M2 is connected via AND gates (likewise only indicated by one AND gate GUm2) and via the aforementioned OR gates to the input side of the comparator Com. The AND gates represented by the AND gate GUm1 are commonly connected by further inputs to the output of a negator (inverter) NG1 which, together with the first inputs of the AND gates represented by the AND gate GUm2, are commonly connected to the output of an AND gate GUm0.

This AND gate GUm0 is connected by one input to the output of the comparator Com and by a further input to a switch T5 contained in the control device Be. When the switch T5 is actuated, a binary "1" is emitted to the input of the AND gate GUm0 which is connected to this switch T5. Therefore, in dependence upon the output signal of the comparator Com a binary "0" or a binary "1", the AND gate GUm0 will emit either a binary "0" or a binary "1" from its output so that either the memory M1 or the memory M2 will be connected to the input side of the comparator Com.

Furthermore, the first inputs of the two further AND gates GUa1, GUa2 are connected to the output of the comparator Com. The AND gate GUa1 is connected by a further input via a negator (inverter) NG2 to a switch T6 which is contained in the control device De and which, when operated, can emit a binary "1". The switch T6 of the control device Be is also connected to a further input of the AND gate GUa2 and to the output A3 of the analysis device Ae. The output of the AND gate GUa1 is connected to the output terminal a1 of the analysis device Ae. The output of the AND gate GUa2 is connected to the output terminal a2 of the analysis device Ae. Only one of the two AND gates GUa1, GUa2 is at any time enabled. The arrangement will be assumed to be such that the AND gate GUa1 is enabled in respect of a binary "1" emitted from the output of the comparator Com when, in the circuit arrangement illustrated in FIG. 1, the oscillator circuit G1 connected to the inductive measuring loop L1 is connected to the input Ze of the frequency divider Fu. In contrast, the AND gate GUa2 will be assumed to be enabled in respect to binary "1's" emitted from the output of the comparator Com when, in the circuit arrangement illustrated in FIG. 1, the oscillator circuit G2 which is lined to the inductive measuring loop L2 is connected to the input Ze of the pulse shaper stepdown circuit Fu. This results in an unique, clear assignment of the signals occurring at the output terminals a1, a2 of the analysis device Ae to the inductive measuring loops L1, L2.

Figure 3:
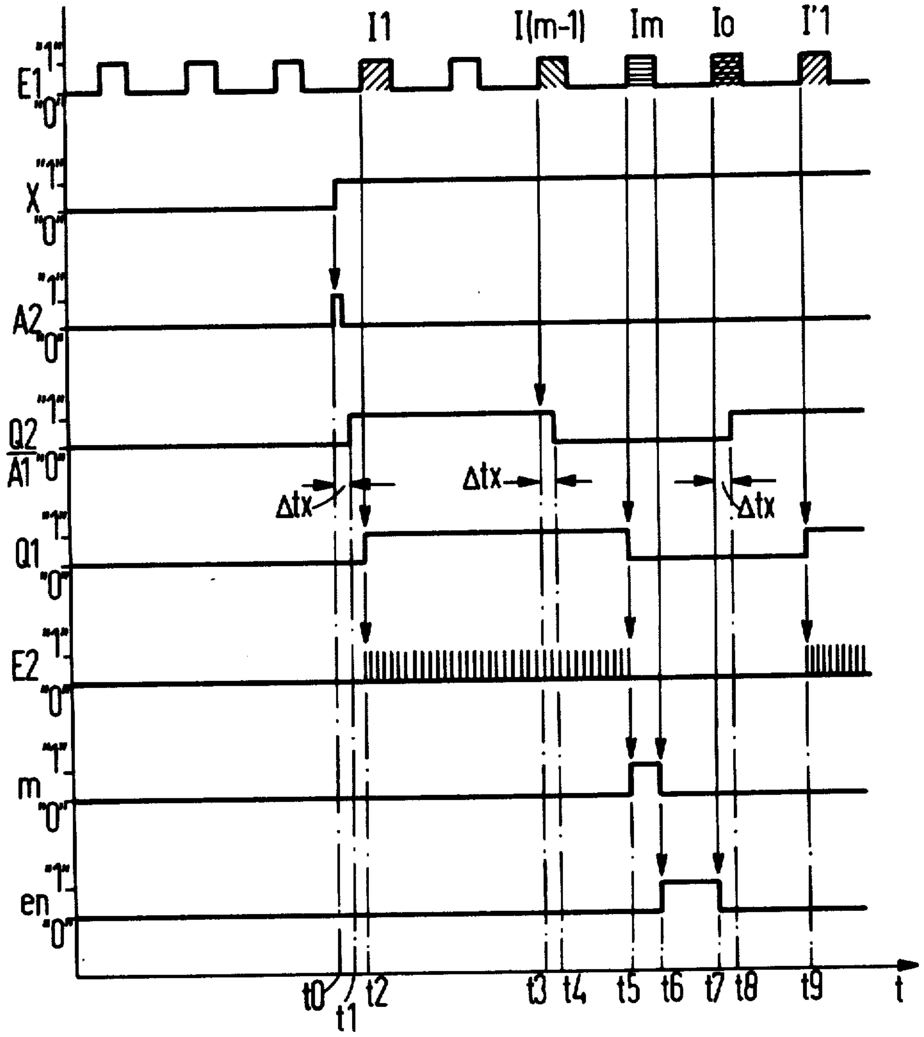
FIG. 3 is a pulse diagram which illustrates the pulses which occur at various circuit points of the circuit arrangement illustrated in FIG. 1 and the analysis device illustrated in FIG. 2.

The above explanation of the possible construction, indicated in FIG. 2, of the analysis device Ae provided in the circuit arrangement illustrated in FIG. 1 and the control device Be connected thereto will now be followed by an explanation, making reference to FIG. 3, of the mode of operation of the analysis device and thus of the circuit arrangement in accordance with the invention. In the form of a pulse diagram FIG. 3 illustrates the time occurrences of pulses at individual circuit points of the arrangements illustrated in FIGS. 1 and 2. Here, the individual pulse sequences and pulses have been referenced by symbols which designate the corresponding circuit points in the arrangements shown in FIGS. 1 and 2. In FIG. 3 the reference character designates the measuring pulse sequence which occurs at the correspondingly designated input E1 of the analysis device Ae. In FIG. 3 the reference character X designates a pulse signal which occurs at a circuit point X which is referenced correspondingly in FIG. 2. In FIG. 2 the circuit point X is connected to the OR gate GO1 provided therein. In FIG. 3 the reference character A2 indicates the curve of a pulse which will be assumed to occur at the correspondingly referenced output A2 of the analysis device Ae. The reference character Q2 in FIG. 3 illustrates the curve of the output pulse occuring at the output Q2 of the bistable trigger element FF2 corresponding to FIG. 2. The reference character Q1 in FIG. 3 illustrates the pulse curve at the correspondingly referenced output Q1 of the bistable trigger element FF1 provided in the circuit arrangement shown in FIG. 1. The reference character Ex in FIG. 3 refers to the counting pulses which occur at the counting input Ez in the circuit arrangement in FIG. 1. In FIG. 3 the reference character m designates the pulse which occurs at the correspondingly referenced output m of the measuring interval counter Cnt2 in FIG. 2. Finally, in FIG. 3 the reference character en designates the pulse curve at the correspondingly referenced enabling input en of the comparator Com in FIG. 2.

We shall now consider in detail the time-based relationships, apparent from FIG. 3, between the individual illustrated pulses and pulse sequences. Here, it will be assumed that at the time t0 marked in FIG. 3 at the circuit point X, a pulse or signal change occurs from the binary level "0" of the binary level "1". This means that in the circuit arrangement illustrated in FIG. 2 the switch T1 and one of the switches T2, T3 are closed. In response to the occurrence of this pulse change, the "1" pulse referenced A2 occurs, which results in the resetting of the two counters Cnt1 and Cnt2, and, following an interval of time Δtx at the time t1 results in the setting of the bistable trigger element FF2 at the output Q2 of which a binary "1" now occurs. Preferably, the counter Cnt2 is set in such manner that it emits a binary "1" from its output a. In this case the aforementioned OR gate GO2 is dispensable. The binary "1" which occurs at the output Q2 of the bistable trigger element FF2 also occurs at the output A1 of the analysis device Ae. It prepares the bistable trigger element FF1 for a subsequent setting. This setting of the bistable trigger element FF1 is carried out with the leading edge of the next measuring pulse I1 which occurs, i.e., at the time t2 indicated in FIG. 3. Consequently, a binary "1" occurs at the output Q1 of the bistable trigger element FF1 which results in the fact that from the time t2 onwards counting pulses Ez having the binary level "1" reach the correspondingly-referenced counting input of the counting pulse counter Cnt1.

On the occurrence of the next to last pulse within the set counting cycle of the measuring interval counter Cnt2, the pulse being indicated by the character I(m−1) in FIG. 3, a binary "0" again occurs at the output Q2 of the bistable trigger element FF2. This corresponds to the time t3 indicated in FIG. 2. The binary "0" which thus occurs at the output A1 of the analysis device Ae at the time t4 after the interval Δtx prepares the bistable trigger element FF1 provided in the circuit arrangement shown in FIG. 1 for a subsequent resetting process.

The resetting of the bistable trigger element FF1 takes place at the time t5 indicated in FIG. 3. At this time, a binary "1" occurs at the last m of the measuring interval counter Cnt2. This is indicated in FIG. 3 by the measuring pulse Im. As the result of the resetting of the bistable trigger element FF1, from the time t5 onwards, the emission of counting pulses Ez from the correspondingly referenced counting input of the counting pulse counter Cnt1 is discontinued.

As can be seen from FIG. 2, the occurrence of a binary "1" at the last output m of the measuring interval counter Cnt2 causes the AND gates GU2 to GUn to the enabled so that the count of the counting pulse counter Cnt1 is transferred into the transfer register Reg1. The overflow of the counter Cnt1 has already been received by this transfer register Reg1 during the measuring interval from t2 - - - t5.

The subtractor device Sub which, in the circuit arrangement illustrated in FIG. 2, is connected by its input to the transfer register Reg1 and to the reference register Reg, establishes the difference between the count of the counting pulse counter Cnt1 which is contained in the transfer register Reg1 and the reference signal which is contained in the reference register Reg2. However, this difference signal is not immediately processed in the comparator Com. In fact, the processing of the difference signal is dependent upon a binary "1" first being supplied to the enable input en of the comparator Com. However, in the circuit arrangement illustrated in FIG. 2, this binary "1" occurs only from the time t6 onwards, i.e., upon the disappearance of the measuring pulse Im. The enable signal "1" at the enable input en of the comparator Com occurs until the time t7 in FIG. 3. At the time t7 a pulse (IO) corresponding to a binary "1" reoccurs at the output a of the measuring interval counter Cnt2 and, following an interval Δtx, at the time t8 produces the same effect as the pulse at the output A2 had previously. At the time t9 the leading edge of the subsequently occurring measuring pulses I'1 again sets the bistable trigger element FF1. Consequently, the above-explained procedures are repeated in a further measuring pulse cycle.

The above-explained mode of operation of the arrangements illustrated in FIGS. 1 and 2, and referring to the diagram shown in FIG. 3, should illustrate the fact that, by means of the measuring interval counter Cnt2, within each counting cycle, by counting a preselected number of measuring pulses it is possible to determine a measuring interval which corresponds to the interval from t2 - - - t5 indicated in FIG. 3. During this measuring interval, the counting pulses which are emitted from the counting pulse generator Tg are counted, the number of which occurring within the measuring interval is inversely proportional to the frequency of the oscillation signals currently emitted from the oscillator circuit G1, G2. This frequency value, which is characteristic of the oscillation signal frequency, is then transferred into and recorded in the transfer register Reg1 of the circuit arrangement shown in FIG. 2, together with the number of overflow signals emitted by the counter Cnt1 during the measuring interval from t2 - - - t5, whereupon they are used for difference formation with a reference frequency value which is contained in the reference register Reg2. This difference signal which in this way is emitted from the output of the subtractor device Sub shown in FIG. 2 thus represents a frequency difference signal. As already indicated in association with the explanation of the circuit arrangement illustrated in FIG. 2, this frequency difference signal is firstly compared with the threshold value signal which is contained in the memory M1 and which will be assumed to characterise a relatively high threshold value. When this relatively high threshold value is exceeded by the frequency difference signal, this frequency difference signal is compared with a lower threshold value which is governed by a threshold value signal made available by the memory M2. If the threshold value signal is exceeded by the frequency difference signal, the comparator Com emits a binary "1" from its output; otherwise it emits a binary "0". As already indicated in the introduction, in this way it is easily possible to determine trucks and other vehicles which, when entering the monitoring zone established by the inductive measuring loop, initially result in a relatively strong change of inductance, and, thereafter, in a comparatively smaller change in inductance relative to the inductance value of the inductive measuring loop.

Finally, as regards the exemplary embodiment of the analysis device Ae illustrated in FIG. 2, it should be noted that the control of the counting of the measuring pulses which determine the duration of the measuring interval, the transfer of the counting pulses counted by the counting pulse counter Cnt1 in FIG. 1 in the transfer register Reg1, the formation of the difference between the counting pulses received by the transfer register Reg1 and a reference signal, and of the comparison between the difference signal thus formed and a threshold value signal can take place in or with the aid of the microprocessor which is provided with a program store which contains the items of program control data which control the running of the individual control processes. The memories M1 and M2 provided in the circuit arrangement illustrated in FIG. 2 can consist of particular memories which are linked to the microprocessor or microcomputer. The measuring interval counter Cnt2 and the registers Reg1, Reg2, and the other circuit elements illustrated in FIG. 2, and the functions thereof, can, however, be represented by the microprocessor or microcomputer. The control device which is illustrated in detail in FIG. 2 can preferably consist of a sequence control device.

Although we have described our invention by reference to particular illustrative embodiments, many changes and modifications of the invention may become apparent to those skilled in the art without departing from the spirit and scope of the invention. We therefore intend to include within the patent warranted hereon also such changes and modifications as may reasonably and properly be included within the scope of our contribution to the art.

We claim:

1. A circuit arrangement for detecting the entry and/or exit of a vehicle into and/or out of a predetermined monitoring zone, comprising:

an inductive loop for disposition in the monitoring zone for sensing passage of vehicles therepast;

an oscillator connected to said inductive loop and operable to produce oscillations at a first frequency when a vehicle is not present in the monitoring zone and at another frequency when a vehicle is in proximity to said inductive loop;

conversion means connected to said oscillator for converting the oscillations into measuring pulses of a lower frequency than that of the oscillations;

a measuring interval counter connected to said conversion means for receiving and counting a preselectable number of measuring pulses, said measuring interval counter including a plurality of selected outputs;

a bistable circuit including a trigger input connected to said conversion means, a set input for receiving a setting signal, and an output;

first logic means including a first input connected to said output of said bistable circuit, a second input, and an output;

a clock for generating counting pulses at a pulse rate higher than that of the measuring pulses, said clock connected to said second input of said first logic means;

a counting pulse counter including a counting input connected to said output of said first logic means, a reset input and at least one output for providing output signals each representing a counting of said counting pulses;

a transfer register including a plurality of inputs, and a plurality of outputs;

second logic means connected between said at least one output of said counting pulse counter and said inputs of said transfer register and connected to and controlled by said selected outputs of said measuring interval counter to transfer the output signals of said counting pulse counter to said transfer register;

reference means including a plurality of outputs for providing signals representing a reference frequency;

a subtractor connected to said outputs of said transfer register and said reference means for forming difference signals representing the difference between the contents of said transfer register and the reference means;

threshold value means including outputs for providing threshold values; and comparison means connected to said subtractor and to said outputs of said threshold value means, including outputs for providing signals representing the comparison results.

2. The circuit arrangement of claim 1, wherein said threshold means comprises:

first storage means storing a first threshold value;

second storage means storing a second threshold value;

third logic means connected between said first and second storage means and said comparison means, said third logic means connected to the output of said comparison means and controlled thereby to selectively connecting said first and second storage means to said comparison means.

3. The circuit arrangement of claim 1, wherein said second logic means comprises:

comparison enabling means connected to said comparison means and to one of said selected outputs of said measuring internal counter defining the end of the measuring interval and operable at the end of the measuring interval to operate said comparison means.

4. The circuit arrangement of claim 1, wherein said reference means comprises:

a reference register including, in common with said transfer register, a control input for receiving a control signal for operating said registers to respective predetermined conditions.

5. The circuit arrangement of claim 1, wherein said reference means comprises:

a reference register including an information input for inputting correction factors.

6. The circuit arrangement of claim 1, and further comprising:

a plurality of said inductive loop and oscillator combinations; and wherein said comparison means comprises a respective output assigned to each of said combinations.

7. The circuit arrangement of claim 6, and further comprising:

display means connected to said outputs of said comparison means.

8. The circuit arrangement of claim 1, and further comprising:

reset means connected to said counters for resetting the same in a cycle defined for sequencing said circuit arrangement.

9. The circuit arrangement of claim 1, wherein said elements, other than said loop and oscillator are constituted by a microcomputer and a program memory.

* * * * *